United States Patent
Radwan et al.

(10) Patent No.: US 9,111,999 B2
(45) Date of Patent: Aug. 18, 2015

(54) TECHNIQUE FOR REDUCING PLASMA-INDUCED ETCH DAMAGE DURING THE FORMATION OF VIAS IN INTERLAYER DIELECTRICS BY MODIFIED RF POWER RAMP-UP

(71) Applicant: GLOBALFOUNDRIES Inc., Grand Cayman (KY)

(72) Inventors: Mohammed Radwan, Dresden (DE); Matthias Zinke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/671,027

(22) Filed: Mar. 27, 2015

(65) Prior Publication Data

US 2015/0200131 A1    Jul. 16, 2015

Related U.S. Application Data

(62) Division of application No. 13/372,901, filed on Feb. 14, 2012, now Pat. No. 9,018,102.

(30) Foreign Application Priority Data

Feb. 23, 2011    (DE) .......................... 10 2011 004 581

(51) Int. Cl.
*H01L 21/302*    (2006.01)
*H01L 21/461*    (2006.01)
*H01L 21/768*    (2006.01)
*H01L 21/311*    (2006.01)
*H01L 23/532*    (2006.01)
*H01L 23/522*    (2006.01)

(52) U.S. Cl.
CPC .... *H01L 21/76802* (2013.01); *H01L 21/31116* (2013.01); *H01L 21/76877* (2013.01); *H01L 23/5226* (2013.01); *H01L 23/53228* (2013.01)

(58) Field of Classification Search
None
See application file for complete search history.

(56) References Cited

U.S. PATENT DOCUMENTS

| 2002/0039843 A1* | 4/2002 | Ikeda et al. ................... 438/738 |
| 2004/0076762 A1 | 4/2004 | Iijima |
| 2008/0110859 A1 | 5/2008 | Koshiishi et al. |
| 2009/0194845 A1* | 8/2009 | Werner et al. ................. 257/532 |
| 2011/0031216 A1* | 2/2011 | Liao et al. ....................... 216/67 |

OTHER PUBLICATIONS

Translation of Official Communication from German Patent Application No. 10 2011 004 581.3 dated Feb. 6, 2012.

* cited by examiner

*Primary Examiner* — Calvin Choi
(74) *Attorney, Agent, or Firm* — Amerson Law Firm, PLLC

(57) ABSTRACT

When performing plasma assisted etch processes for patterning complex metallization systems of microstructure devices, the probability of creating plasma-induced damage, such as arcing, may be reduced or substantially eliminated by using a superior ramp-up system for the high frequency power and the low frequency power. To this end, the high frequency power may be increased at a higher rate compared to the low frequency power component, wherein, additionally, a time delay may be applied so that, at any rate, the high frequency component reaches its target power level prior to the low frequency component.

14 Claims, 5 Drawing Sheets

TECHNIQUE FOR REDUCING PLASMA-INDUCED ETCH DAMAGE DURING THE FORMATION OF VIAS IN INTERLAYER DIELECTRICS BY MODIFIED RF POWER RAMP-UP

CROSS-REFERENCE TO RELATED APPLICATION

This is a divisional of co-pending application Ser. No. 13/372,901, filed Feb. 14, 2012, which claimed priority from German Patent Application No. 10 2011 004 581.3, filed Feb. 23, 2011.

BACKGROUND OF THE INVENTION

1. Field of the Invention

Generally, the present disclosure relates to integrated circuits, and, more particularly, to the manufacture of metallization layers including conductive materials, such as copper, embedded into a dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, that are filled with an appropriate metal. Thus, the vias provide the electrical connection between two neighboring stacked metallization layers.

Due to the continuous reduction of feature sizes of circuit elements in modern integrated circuits, the number of circuit elements for a given chip area, that is, the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The vias may typically be formed by etching an opening into a respective interlayer dielectric material, which in sophisticated applications may be a low-k material or an ultra-low-k (ULK) material having a dielectric constant of 2.7 and less. In combination with these highly sensitive dielectric materials, a highly conductive metal, such as copper or copper alloys, is used that is subsequently filled into the opening, typically together with an appropriate conductive barrier material. Due to the reduced dimensions of the vias, sophisticated anisotropic etch techniques are usually necessary for forming the high aspect ratio openings.

For example, in sophisticated semiconductor devices, the vias or trenches in lower-lying metallization layers have to comply with the high packing density that is realized in the device level, i.e., in and above the semiconductor material in which transistors, capacitors, resistors and the like are formed on the basis of a semiconductor material. Consequently, the vias and trenches to be formed in the dielectric material may have a dimension in at least one lateral dimension that is 100 nm and less, while a thickness of the interlayer dielectric material may be several hundred nanometers, thereby yielding an aspect ratio, i.e., a ratio of depth to width, of any such openings of 5 and significantly higher. Hence, sophisticated plasma assisted anisotropic etch recipes have to be applied in combination with complex patterning strategies, i.e., sophisticated lithography processes and hard mask regimes, since typically a resist material cannot be provided with sufficient thickness so as to act as an etch mask for etching through the entire interlayer dielectric material. It has been observed that the patterning of the interlayer dielectric material may result in significant particle contamination and thus yield loss, which is, to a large extent, due to plasma-induced damage that occurs during the etch process. Basically, during plasma etching, reactive ions are created and are accelerated towards the surface to be treated in order to obtain a high directionality for providing a moderately high physical removal component of the incoming ions so that a substantially perpendicularly oriented removal component in combination with the chemical interaction of the reactive ions is achieved.

Moreover, as discussed above, high aspect ratio openings are typically to be formed, thereby requiring additional measures for controlling the lateral etch rate within the high aspect ratios. To this end, appropriate precursor materials may be added to the etch atmosphere in order to form polymer compounds that significantly reduce a lateral etching rate, while substantially not affecting the vertical progress of the corresponding etch front. Due to the very complex conditions within the plasma etch atmosphere, increasingly, positive ions accumulate in a lower portion of the etched openings, while negative charge accumulates in an upper portion thereof, thereby increasingly building up a vertical potential difference. Consequently, due to the highly local separation of positive and negative charges a localized potential difference is created in the vicinity of corresponding openings, wherein the potential difference, thus, may significantly depend on the aspect ratio, the local neighborhood, i.e. pattern density, and the like. In particular, the effect of a significant potential difference is particularly pronounced in situations in which dielectric material is increasingly removed from above a conductive area, such as a metal region of a lower-lying metallization layer. Consequently, upon reaching a certain critical thickness of the dielectric material, the potential difference may result in a dielectric breakdown of the remaining dielectric material, i.e., a non-controlled discharge occurs, which is also referred to as an arcing event. In this case, a significant amount of particles may be generated, for instance in the form of "burned" dielectric material, metal material and the like, wherein these particles are typically distributed over a wide area of the semiconductor substrate, thereby significantly increasing the overall contamination, which in turn may result in significant yield losses, or may at least cause a deterioration of reliability of the resulting semiconductor devices. Thus, the frequency of the occurrence of arcing events may significantly affect the yield per substrate, wherein, however, the occurrence of these events is difficult to predict since a plurality of factors may play an important role, such as plasma instabilities, the overall surface structure conditions, such as pattern density, the presence of lower-lying metal regions and their size and the like. For instance, the frequency of arcing events during dielectric etch processes may be extremely low in the absence of any lower-lying metal regions, wherein a significant increase of the frequency of these events is observed during the formation of metallization structures of sophisticated semiconductor devices.

As discussed above, in particular the process of forming vias may result in significant plasma-induced damage, since here the vertical potential difference may result in an increasing voltage across the very thin dielectric material upon finally clearing the bottom surface of the openings. That is, typically, a main etch process is performed so as to etch through the interlayer dielectric material, which in sophisticated applications is provided in the form of a low-k dielectric material or a ULK material, as discussed above, while, in a final phase of the etch sequence, the etch conditions are typically changed upon exposing an etch stop material and etching through this material, thereby also requiring a certain length of an over-etch time in order to reliably remove the material in any of the openings, since the etch rate may also significantly depend on the local conditions across the substrate. In this case, faster etching circuit features may encounter a thinned dielectric material on the basis of the same global plasma conditions, which may thus result in a high probability of creating a dielectric breakdown of the resulting thin dielectric material immediately prior to completely clearing the corresponding interface formed with the lower-lying metal region.

Observations indicate that the occurrence of arcing events is highly correlated with certain areas in the substrate, wherein, in particular, the wafer edge has been identified as a source of frequent arcing events. Consequently a plurality of "geometric" remedies for the occurrence of wafer edge related etch damage has been proposed, such as a change of the etch die exposure, in which non-yielding semiconductor die are substantially excluded from being exposed during the lithography process, thereby, however, contributing to a significantly reduced throughput caused by the reduced lithography capacity. In other cases, the resist material at the wafer edge may be applied in a more restricted manner, thereby, however, contributing to alignment problems. Also, the metal layers, such as copper layers, may be provided with increased exclusion zones, which, however, may result in increased material delamination at the wafer bevel, which in turn also significantly contributes to particle generation and thus yield losses.

In other approaches for reducing plasma-induced damage, generally the plasma conditions may be modified, for instance, by generally reducing the plasma power and increasing the process pressure of the plasma atmosphere during the etch process, which, however, may also reduce throughput and also contradicts other constraints of the plasma etch process, in which higher plasma density and high pressure is favored so as to obtain superior etch profiles and the like.

Typically, a plurality of plasma etch regimes are used in the field of semiconductor fabrication, wherein, however, in sophisticated plasma etch processes, often a so-called dual frequency regime may be applied in which electromagnetic power is supplied to the etch atmosphere on the basis of two different radio frequencies (RF). For example, a high frequency component having a frequency of several MHz to some GHz may be applied so as to substantially provide a plasma from a given carrier gas, i.e., ions and separated electrons, while a lower frequency of several hundred kHz to several MHz may be used to establish a desired bias voltage between the actual plasma and the substrate. In combination with appropriately selected reactive species and by adjusting the overall pressure in the etch atmosphere, the desired anisotropic etch behavior is obtained, wherein it should be appreciated that the configuration of a corresponding plasma reactor may also have a significant influence. On the other hand, irrespective of the geometric configuration of the plasma reactor, in particular, the electromagnetic power supplied with different radio frequencies represents a promising control mechanism for adjusting the overall plasma conditions and thus etch results, wherein any such control mechanisms may readily be applied to any given reactor configuration.

In view of the situation described above with reference to plasma etch conditions for patterning sophisticated metallization systems of semiconductor devices, the present disclosure relates to techniques for efficiently controlling sophisticated plasma etch processes, while avoiding or at least reducing one or more of the effects identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which superior control of plasma conditions may be achieved without requiring any "geometric" corrections of the semiconductor substrates, which conventionally may be used for reducing arcing events at the cost of a significantly reduced overall throughput. To this end, an improved "ramp-up" regime may be applied at a very advanced phase of the etch process in order to take account of the increasing probability of creating dielectric breakdown events upon clearing the etch surface, in particular in fast etching circuit features. A ramp-up is to be understood as a phase of an etch process in which, in particular, the power levels of the electromagnetic power supplied to the etch atmosphere are increased in a controlled manner so as to finally achieve the desired target power level for the particular etch step under consideration. It has been recognized that in particular the ramp-up phase has to be selected differently for the high frequency electromagnetic power and the low frequency electromagnetic power in order to reduce or substantially eliminate the occurrence of arcing events. To this end, after a significant portion of the dielectric material under consideration has been removed, and prior to actually clearing a bottom surface of any etch openings, a corresponding "over-etch" step is typically applied, which, according to the principles disclosed herein, may be initiated on the basis of a ramp-up regime in which the high frequency power is increased faster and/or with a high frequency power to low frequency power ratio having a minimum value in order to reduce the building up of a potential difference that may exceed the dielectric strength of the remaining dielectric material. Moreover, generally, the ramp-up of the electromagnetic power may be reduced compared to conventional plasma etch strategies. In other illustrative aspects disclosed herein, a plurality of "over-etch" steps may be applied, each of which may be initiated on the basis of a ramp-up regime, as described before, wherein each individual over-etch step may be performed on the basis of an increased power level compared to a preceding over-etch step. In this manner, even a very complex increase of the power level may be approximated by iterative over-etch steps so as to obtain the final target power level for completely etching through the dielectric material without contributing to a pronounced probability of creating arcing events.

One illustrative method disclosed herein comprises establishing a first plasma etch atmosphere in a process environment by supplying electromagnetic power of a first radio frequency and electromagnetic power of a second radio frequency to the process environment, wherein the first radio frequency is higher than the second radio frequency. The method further comprises forming an opening in a dielectric layer of a metallization structure of a microstructure device by exposure to the first plasma etch atmosphere, wherein the opening is positioned above a conductive region and extends to a first depth in the dielectric material. The method further comprises at least reducing supply of electromagnetic power of the first and second radio frequencies. Next, a second plasma etch atmosphere is established in the process environment by increasing electromagnetic power of the first radio frequency within a first time interval and increasing electromagnetic power of the second radio frequency within a second time interval that starts temporarily delayed with respect to the first time interval. Additionally, the method comprises increasing a depth of the opening so as to extend to a second depth by exposing the dielectric material to the second plasma etch atmosphere.

A further illustrative method disclosed herein comprises performing a main etch step on the basis of a main etch plasma atmosphere so as to form an opening in a dielectric material of a metallization system of a semiconductor device. The method further comprises performing a plurality of over-etch steps on the basis of an over-etch plasma atmosphere, wherein each of the plurality of over-etch steps comprises an increase of electromagnetic power of a first radio frequency and an increase of electromagnetic power of a second radio frequency. Moreover, in each over-etch step, the increase of electromagnetic power of the first radio frequency is faster than the increase of electromagnetic power of the second radio frequency, wherein the first radio frequency is higher than the second radio frequency.

A still further illustrative method disclosed herein comprises performing a first plasma etch process so as to form an opening in a dielectric layer of a metallization system of a semiconductor device, wherein the opening extends to a first depth in the dielectric material. Moreover, a plasma atmosphere of a second plasma etch process is established by increasing electromagnetic power of a first radio frequency up to a first target power level at a first rate and increasing electromagnetic power of a second radio frequency at a second rate up to a second target power level, wherein the first rate is greater than the second rate and wherein the first radio frequency is higher than the second radio frequency. Additionally, the method comprises performing the second plasma etch process so as to increase a depth of the opening to achieve a final depth of the opening.

BRIEF DESCRIPTION OF THE DRAWINGS

The disclosure may be understood by reference to the following description taken in conjunction with the accompanying drawings, in which like reference numerals identify like elements, and in which.

Figure 1A:
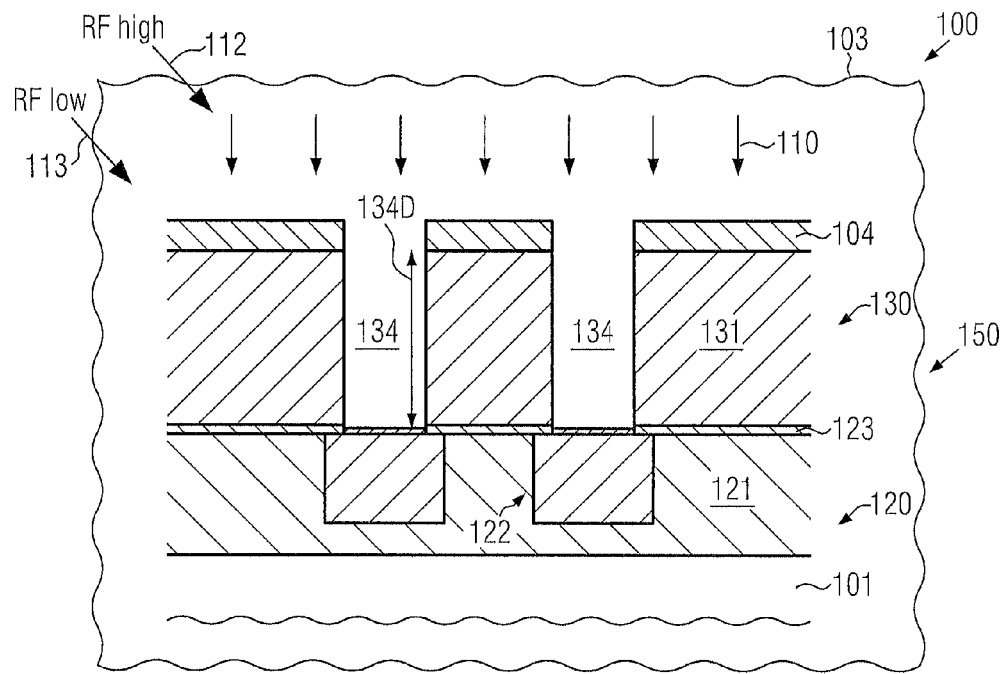
FIG. 1a schematically illustrates a cross-sectional view of a semiconductor device during a "main etch" step for forming openings in the dielectric material of a metallization layer with a desired depth, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which a sophisticated plasma etch process performed on the basis of a dual frequency regime may be controlled so as to reduce or substantially eliminate the occurrence of dielectric breakdown events when patterning the interlayer dielectric material of a metallization system. To this end, it has been recognized that, in particular, the increase of the radio frequency power, also referred to herein as electromagnetic power, may have a decisive influence on the finally obtained etch result. Generally, upon performing plasma etch processes, a desired plasma power level is determined for both frequency components, for instance a range of one hundred to several hundred or more W of the high frequency electromagnetic power, which may range from several MHz to several GHz, is typically appropriate for performing sophisticated plasma etch recipes. Similarly, the low frequency power, ranging from several hundred kHz, or even lower to several MHz, may be applied from values of several W to several hundred W in order to comply with etch profile requirements, throughput requirements and the like. Since the radio frequency generators and thus the supply of the electromagnetic powers of different radio frequencies may be controlled separately, applying an appropriate ramp-up regime, i.e., the time progression of increasing the corresponding power component, may be used as an efficient control mechanism in order to avoid or reduce arcing events. It has been recognized that basically the critical phase of the etch process is the time interval in which only a very thin dielectric material layer is still present and, thus, depending on the local variability of the etch rates in the underlying conductive regions, start to be cleared. To this end, typically, a different plasma etch process atmosphere may be applied, which is typically referred to as an over-etch process, in order to reliably remove any dielectric material, irrespective of the position within a semiconductor die or semiconductor substrate. Since, in faster etching circuit features, the corresponding thickness of the dielectric material during the over-etch time may be significantly less compared to slower etching features, a corresponding increase of the electromagnetic power-up to the required final target power level may thus result in electrical breakdown events, thereby causing the non-desired contaminations, as described above. Consequently, by generally reducing the overall ramp-up rate and, in particular, by applying a different ramp-up regime for each of the two RF components, the probability of arcing events may be significantly reduced.

In some illustrative embodiments disclosed herein, a single modified ramp-up regime may be applied during the final phase of the etch process, i.e., during the over-etch phase, in which the high frequency power is increased at a faster rate compared to the low frequency power, while additionally or alternatively a time delay may be introduced after starting the increase of the high frequency power. That is, the increase of the lower frequency power is initially delayed with respect to the increase of the higher frequency power, wherein, in some illustrative embodiments, additionally, a certain ratio of high frequency power to low frequency power is controlled so as to be equal to or above the value 2. In this manner, plasma etch recipes may be appropriately controlled in situations in which the degree of arcing is considered less pronounced so that a single ramp-up regime prior to the over-etch phase may efficiently avoid or reduce the number of arcing events. Depending on the limitations of the available hardware configuration, one or more of the above-specified measures may be taken in order to approximate an "ideal" ramp-up regime.

In other situations in which a more complex progression of increasing the plasma power during the over-etch phase is considered necessary, a corresponding approximation may be achieved by introducing a plurality of over-etch steps, at least some of which may have the modified ramp-up regime, so as to finally obtain, after a plurality of appropriately initiated over-etch steps, the final target power levels for the high frequency power and the low frequency power, which may then be used for the remaining over-etch time. Consequently, for etch situations in which a pronounced plasma-induced damage is observed when applying conventional recipes, a complex ramp-up regime may be applied by using the plurality of individual over-etch steps.

FIG. 1a schematically illustrates a cross-sectional view of a semiconductor device 100 when exposed to plasma etch atmosphere 110 that may be established within an appropriate process environment 103, such as a plasma etch reactor and the like. In the manufacturing stage shown, the semiconductor device 100 may comprise any appropriate substrate 101, in and above which semiconductor elements, such as transistors, resistors and the like, may be provided, which may require a complex wiring network, which may be established on the basis of a metallization system 150. As discussed above, the metallization system 150 may comprise a plurality of metallization layers, depending on the overall complexity of the device 100. In some illustrative embodiments, the metallization system 150 may comprise metallization layers 120, 130, which may include sophisticated materials, such as low-k materials, ULK materials and the like, in combination with highly conductive metals, such as copper, copper alloys and the like. As shown, the metallization layer 120 may comprise a dielectric material 121 and metal regions 122, while the metallization layer 130 may comprise, in this manufacturing stage, a dielectric material 131, which may be separated from the dielectric material 121 by an etch stop layer 123. It should be appreciated that although the etch stop layer 123 may have a higher etch resistivity and a superior dielectric strength compared to the materials 131, 121, nevertheless, upon introducing very sophisticated interlayer dielectric materials, also the corresponding etch stop materials may be provided with reduced dielectric constant values, thereby also reducing the dielectric strength thereof. Moreover, openings 134 may be formed so as to extend to a certain depth 134D, for instance extending to or into the layer 123.

The semiconductor device 100 as shown in FIG. 1a may be formed on the basis of any appropriate process strategy for providing circuit elements in and above the substrate 101 and forming the metallization system 150, for instance by depositing appropriate dielectric materials and patterning the same, followed by the deposition of any appropriate conductive material. For example, when forming the metallization layer 130, the material 131 may be deposited, followed by a complex lithography process for patterning an etch mask 104, such as a hard mask. Thereafter, the etch atmosphere 110 is established by supplying, in a dual frequency regime, electromagnetic power with high frequency, as discussed above, as indicated by 112, and electromagnetic power with lower frequency, as indicated by 113. At the beginning, the probability of creating any plasma-induced damage is low and, thus, conventional ramp-up regimes, i.e., a moderately fast ramp-up of both power components 112, 113 may be applied. Consequently, during the etch process 110, the openings 134 may be created with increasing depth, wherein finally the etch stop material 123 may be exposed so as to significantly slow down the etch process. As discussed above, during the process 110, increasingly, a differential potential may build up in the vertical direction, depending on a plurality of factors, such as local neighborhood of the openings 134, plasma conditions and the like. It should be appreciated that the etch stop layer 123 may not necessarily be provided so that the etch process 110 may be controlled so as to have at least a portion of the material 131, the thickness of which may, however, be different in various device areas, depending on factors such as local etch rate and the like.

Figure 1B:
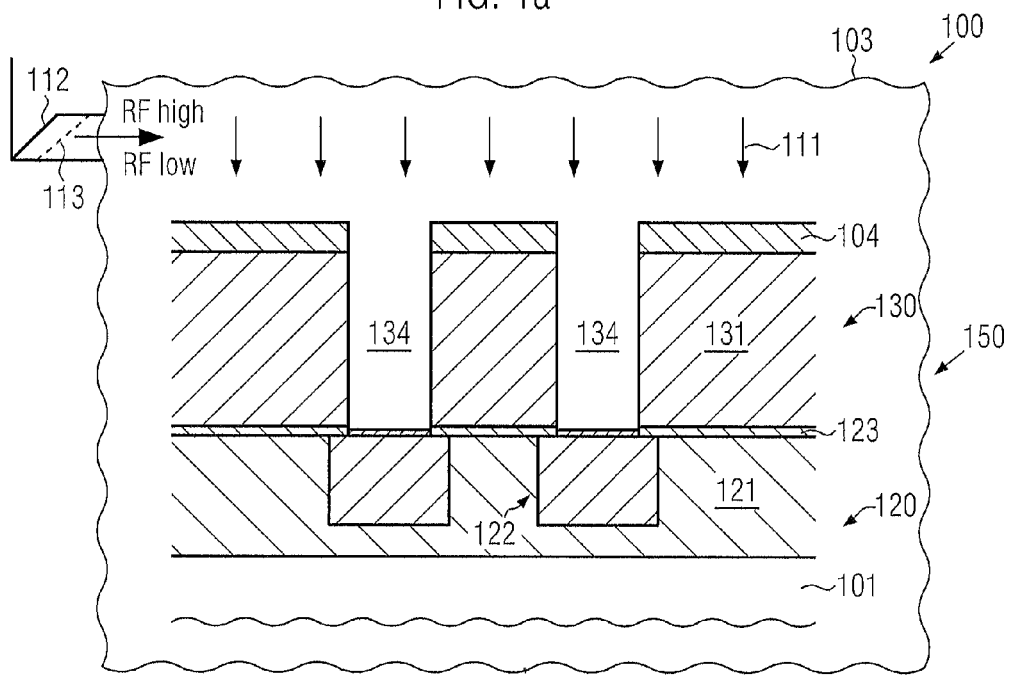
FIG. 1b schematically illustrates the device in a subsequent plasma etch process for reducing the remaining dielectric material from above a conductive region, which may also be referred to herein as an "over-etch" step, and which is based on a modified ramp-up regime, according to illustrative embodiments.

FIG. 1b schematically illustrates the device 100 in a phase in which at least one further etch atmosphere 111 may be established within the environment 103. To this end, the previously used power levels for the electromagnetic power components 112, 113 may be reduced or may be set to zero in order to enable an appropriate initialization of the over-etch step 111. Thereafter, an appropriate ramp-up regime may be applied in which generally the ramp-up for the two power components may be controlled differently.

Figure 1C:
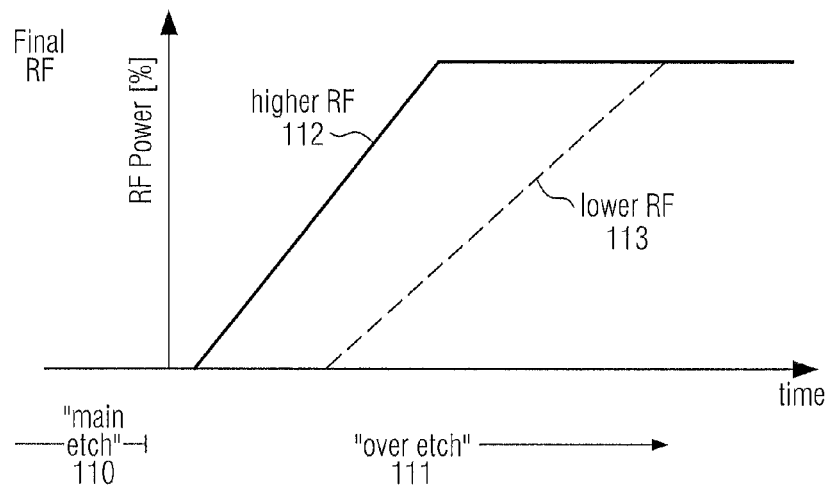
FIG. 1c schematically illustrates a graph representing a typical ramp-up regime for the high radio frequency power and the low frequency power, according to illustrative embodiments.

FIG. 1c schematically illustrates a graph which illustrates the increase of the power components 112, 113 over time during an initial phase or ramp-up phase of the process 111. The solid line represents the progression or increase of the power component 112 over time, wherein a substantially linear behavior is illustrated, which may depend on the capability of the corresponding hardware resources used for providing the environment 103 (FIG. 1b). On the other hand, the lower frequency power component 113 is illustrated as a dashed line. It should be appreciated that the vertical axis represents corresponding RF power components in percent so that, for a given etch recipe, after the ramp-up phase, both components have reached 100 percent, which, however, may represent different absolute values, depending on the corresponding required power levels for the components 112, 113. In the example shown, the component 112 may be increased at a faster rate, as is indicated by a steeper progression compared to the component 113. Moreover, in some illustrative embodiments, the beginning of the ramp-up or increase of the component 113 may be delayed with respect to the increase of the component 112, wherein a corresponding delay may be readily determined on the basis of experiments. For example, a time delay of several seconds may be applied, thereby providing superior advantages for avoiding arcing events while not unduly reducing overall throughput of the etch process. Consequently, due to the reduced ramp-up rate of the component 113 and due to the time delay, the high frequency power is already available with 100 percent, thereby efficiently generating the desired plasma conditions, while the low power component is still to be increased, thereby efficiently avoiding the building up of a non-desired high vertical potential within the openings 134 (FIG. 1b). In still other illustrative embodiments, generally, the ratio of high frequency power 112 to low frequency power 113 may be kept at two or greater by also efficiently suppressing the building up of non-desirable high vertical potentials. It is to be noted that, based on conventional process recipes, the corresponding ramp-up phases may be used as a starting point and the ramp-up time intervals contained therein may be at least approximately 10-50% or even more, regarding the higher frequency component 112, while the ramping up of the lower frequency component 113 may then be established in accordance with FIG. 1c, i.e., a reduced ramp-up rate may be applied, possibly in combination with a time delay, while also the above-specified ratio may be preserved.

Figure 1D:
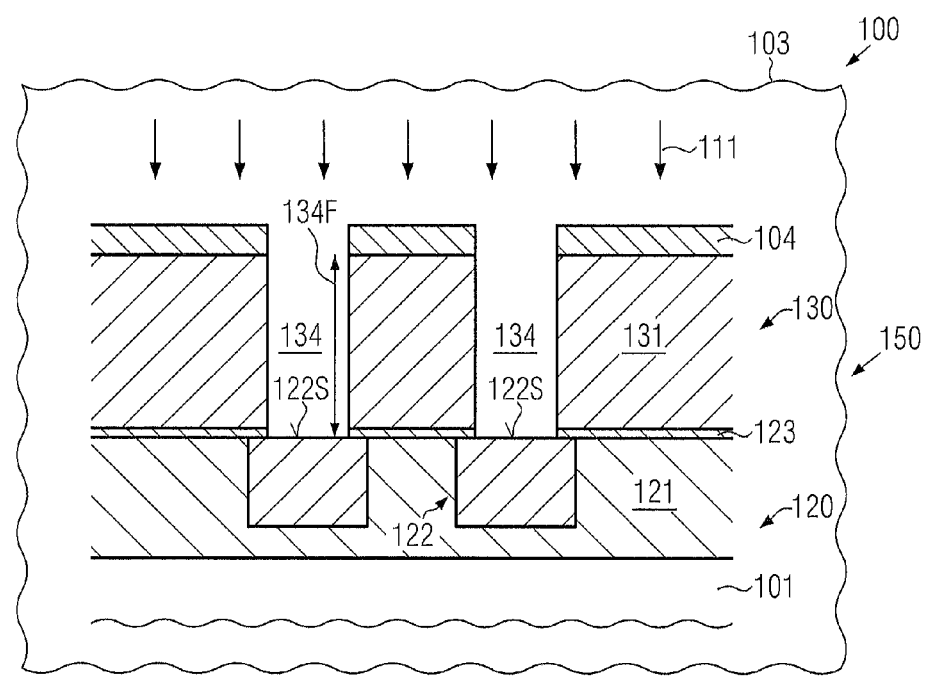
FIG. 1d schematically illustrates the device at the end of the corresponding over-etch step, according to illustrative embodiments.

FIG. 1d schematically illustrates the semiconductor device 100 during a final phase of the over-etch step 111 in which a final depth 134F of the openings 134 is reached, for instance, by exposing the surface areas 122S of the conductive regions 122, while significantly reducing the probability of creating arcing events.

Figure 1E:
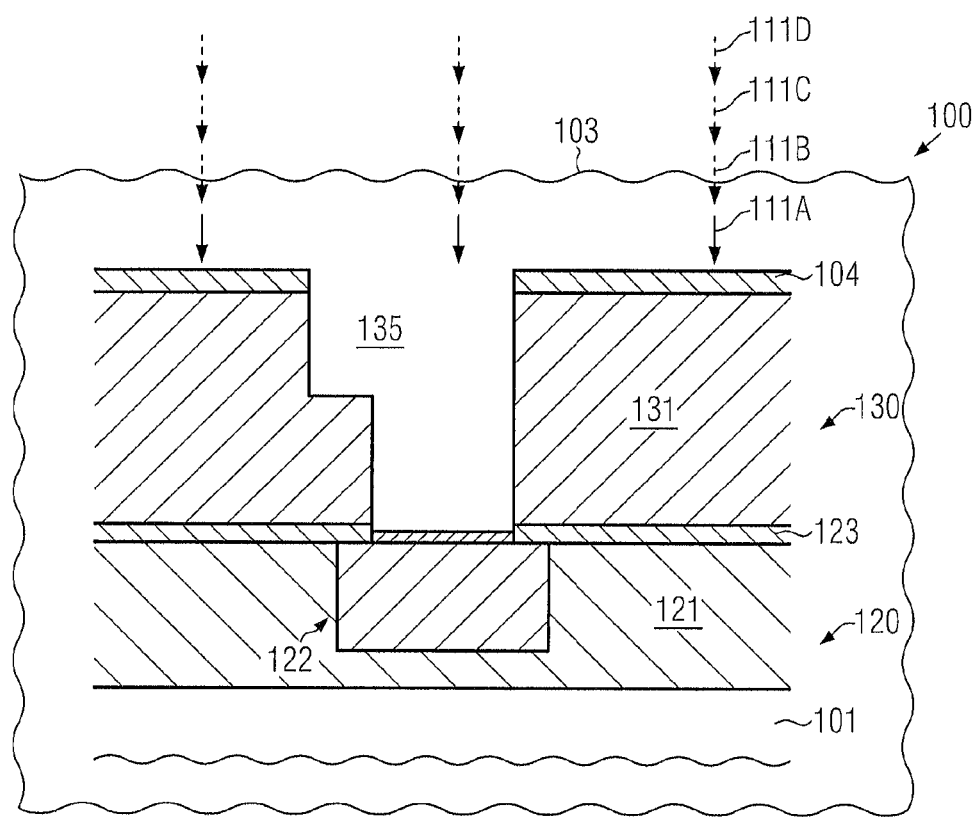
FIG. 1e schematically illustrates a cross-sectional view of the semiconductor device when exposed to a plurality of "cascaded" over-etch steps that may be applied upon clearing an opening during sophisticated etch conditions, wherein the sequence of over-etch steps may be performed with freezing power levels and wherein at least some of the over-etch steps may be initiated on the basis of a ramp-up regime similar to that as shown in FIG. 1c, according to illustrative embodiments.

FIG. 1e schematically illustrates the device 100 according to further illustrative embodiments in which an etch situation may be considered that has been identified to have a pronounced probability for the occurrence of arcing events. For example, an opening 135 may represent a corresponding etch situation, which may thus require a more complex ramp-up regime. To this end, in some illustrative embodiments, a plurality of over-etch steps 111A, 111B, 11C, 111D may be applied, wherein each of the sequence of steps 111A-111D may be performed with an appropriately set target power level that increases with each subsequent over-etch step. That is, the steps 111A-111D represent a cascaded sequence of etch steps, wherein the step 111A may have the lowest target power level and the process 111D may have the highest target power level for obtaining the final depth of the opening 135.

Figure 1F:
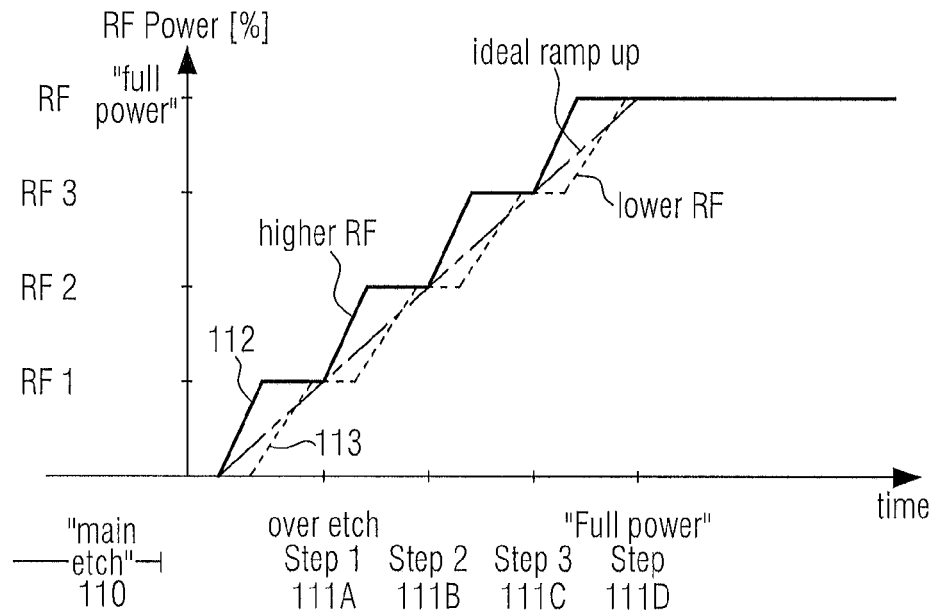
FIGS. 1f and 1g schematically illustrate graphs for illustrating a sequence of over-etch steps with superior ramp-up regimes, according to illustrative embodiments.

FIG. 1f schematically illustrates a graph in which an ideal ramp-up progression, indicated as a dashed dotted line, may be approximated by the plurality of over-etch steps 111A-111D so as to obtain the desired final full power target level. In the embodiment illustrated in FIG. 1f, each of the steps 111A-111D may itself comprise a ramp-up regime as discussed above with reference to FIG. 1c and the process 111 described therein. For example, generally, the ramp-up of the higher frequency component 112 may be faster compared to the component 113, while also, if required, a time delay may be inserted. Additionally, as discussed above, generally the ratio of the power components 112, 113 may be capped at two or higher. Consequently, each step may finally be performed with the corresponding target power level, indicated by RF1, RF2, RF3 and RF "full power," wherein each of these target power levels may be reached on the basis of a superior ramp-up regime, as is already described above with reference to FIG. 1c.

Figure 1G:
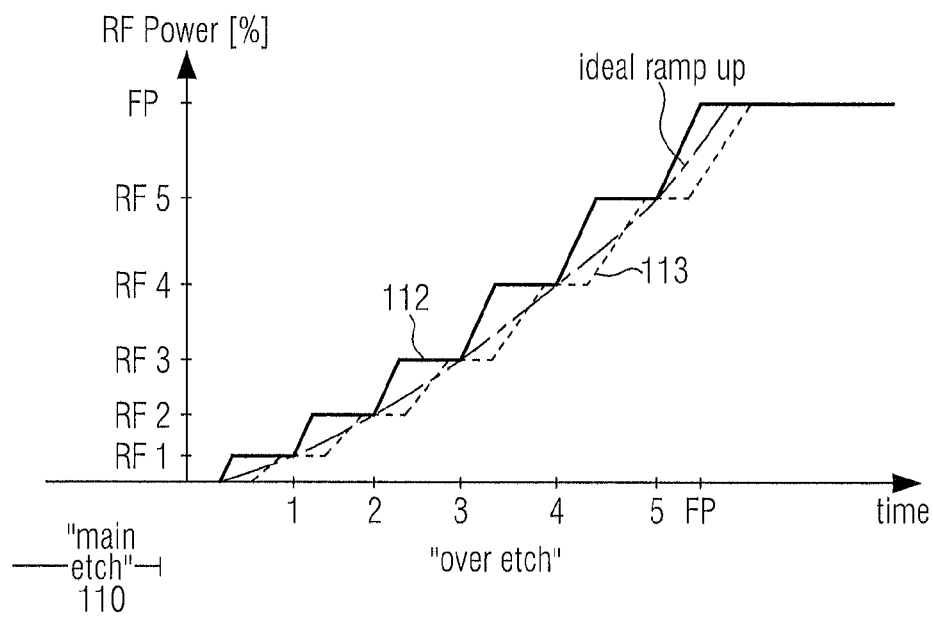

FIG. 1g schematically illustrates a situation in which the ideal ramp-up curve may have an even more pronounced non-linear behavior, which may be approximated by a larger number of individual over-etch steps, indicated as 1, 2, 3, 4, 5 and FP. Moreover, corresponding target power levels may be selected for each of these steps, as already described above, and at least some of these steps may be initiated by using an appropriate ramp-up regime, as is also described above. Consequently, in this manner, even for given hardware limitations, a moderately complex non-linear ramp-up regime may be approximated, thereby reducing or substantially eliminating the occurrence of plasma-induced damage in complex etch situations.

Figure 1H:
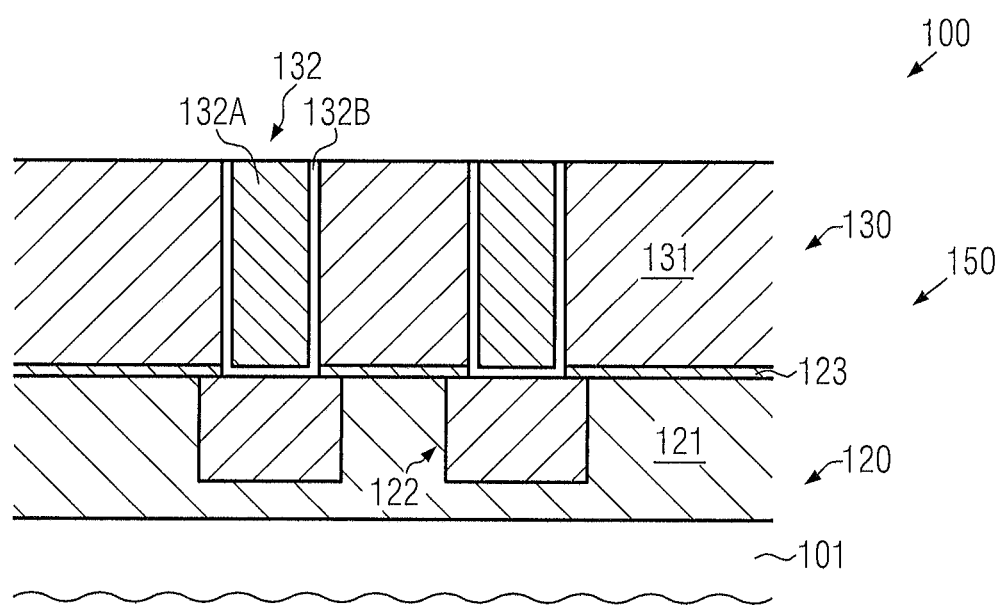
FIG. 1h schematically illustrates a cross-sectional view of the semiconductor device with vias formed in the metallization system after performing the plasma etch sequence.

FIG. 1h schematically illustrates the semiconductor device 100 in a further advanced manufacturing stage. As shown, the metallization layer 130 may have formed therein vias or any other metal regions 132, which may be comprised of a highly conductive core metal 132A, such as copper and the like, possibly in combination with a barrier material 132B. To this end, well-established process strategies may be applied, such as the deposition of the materials 132B, 132A and the removal of any excess portion thereof by chemical mechanical polishing (CMP) and the like. As a result, complex metallization systems may be implemented in semiconductor devices and, generally, microstructure devices by using complex material systems, which have to be patterned on the basis of plasma assisted etch recipes. The probability of creating plasma-induced damage upon patterning the interlayer dielectric material may be reduced by implementing a superior ramp-up regime, in particular at a final phase of the etch sequence, for instance, by applying an appropriately initiated over-etch step or a plurality thereof in which the high frequency power component and the low frequency power component is increased to their final target level for a corresponding over-etch step with at least one different process parameter that ensures that the target power level of the high frequency component is reached faster compared to the target power level of the low frequency component.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    establishing a first plasma etch atmosphere in a process environment by supplying electromagnetic power of a first radio frequency and electromagnetic power of a second radio frequency to said process environment, said first radio frequency being higher than said second radio frequency;
    forming an opening in a dielectric layer of a metallization structure of a microstructure device by exposure to said first plasma etch atmosphere, said opening being positioned above a conductive region and extending to a first depth in said dielectric material;
    at least reducing supply of electromagnetic power of said first and second radio frequencies;
    establishing a second plasma etch atmosphere in said process environment by increasing electromagnetic power of said first radio frequency within a first time interval and increasing electromagnetic power of said second radio frequency within a second time interval that starts at some point after said first time interval is started; and
    increasing a depth of said opening so as to extend to a second depth by exposing said dielectric material to said second plasma etch atmosphere.

2. The method of claim 1, wherein said first time interval is shorter than said second time interval.

3. The method of claim 2, wherein a ratio of electromagnetic power of said first radio frequency to said electromagnetic power of said second radio frequency in said second plasma etch atmosphere is equal to or greater than 2.

4. The method of claim 1, further comprising establishing a third plasma etch atmosphere in said process environment by increasing electromagnetic power of said first radio frequency within a third time interval and increasing electromagnetic power of said second radio frequency within a fourth time interval, wherein said method further comprises increasing the depth of said opening to a target depth by exposure to said third plasma etch atmosphere.

5. The method of claim 4, wherein said fourth time interval starts at some point after said third time interval is started.

6. The method of claim 4, wherein said third time interval is shorter than said fourth time interval.

7. The method of claim 4, wherein a ratio of said electromagnetic power of said first radio frequency to said electromagnetic power of said second radio frequency is equal to or greater than 2.

8. The method of claim 1, wherein increasing a depth of said opening comprises exposing a portion of said conductive region.

9. The method of claim 7, wherein increasing the depth of said opening comprises exposing a portion of said conductive region when exposed to said third plasma etch atmosphere.

10. The method of claim 1, further comprising forming a copper-containing material in said opening so as to connect to said conductive region.

11. A method, comprising:
    establishing a first plasma etch atmosphere in a process environment by supplying electromagnetic power of a first radio frequency and electromagnetic power of a second radio frequency to said process environment, said first radio frequency being higher than said second radio frequency;
    forming an opening in a dielectric layer of a metallization structure of a microstructure device by exposure to said first plasma etch atmosphere, said opening being positioned above a conductive region and extending to a first depth in said dielectric layer;
    at least reducing supply of electromagnetic power of said first and second radio frequencies;
    establishing a second plasma etch atmosphere in said process environment by increasing electromagnetic power of said first radio frequency within a first time interval and increasing electromagnetic power of said second radio frequency within a second time interval that starts at some point after said first time interval is started, wherein said first time interval is shorter than said second time interval and wherein a ratio of electromagnetic power of said first radio frequency to said electromagnetic power of said second radio frequency in said second plasma etch atmosphere is equal to or greater than 2; and
    increasing a depth of said opening so as to extend to a second depth by exposing said dielectric layer to said second plasma etch atmosphere.

12. The method of claim 11, further comprising establishing a third plasma etch atmosphere in said process environment by increasing electromagnetic power of said first radio frequency within a third time interval and increasing electromagnetic power of said second radio frequency within a fourth time interval, wherein said method further comprises increasing the depth of said opening to a target depth by exposure to said third plasma etch atmosphere.

13. The method of claim 12, wherein said fourth time interval starts at some point after said third time interval is started.

14. The method of claim 12, wherein said third time interval is shorter than said fourth time interval.

* * * * *